(12) United States Patent
Yoon (10) Patent No.: US 8,339,854 B2
(45) Date of Patent: Dec. 25, 2012

(54) NONVOLATILE MEMORY DEVICE AND DATA RANDOMIZING METHOD THEREOF

(75) Inventor: Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 12/752,255

(22) Filed: Apr. 1, 2010

(65) Prior Publication Data

US 2010/0259983 A1    Oct. 14, 2010

(30) Foreign Application Priority Data

Apr. 8, 2009  (KR) .................. 10-2009-0030504

(51) Int. Cl.
  *G11C 11/34* (2006.01)
(52) U.S. Cl. ............... 365/185.12; 365/185.18; 365/211
(58) Field of Classification Search ............. 365/185.12, 365/185.18, 211, 185.11, 185.25, 185.22, 365/185.19, 189.09, 185.03, 185.09, 230.03
  See application file for complete search history.

(56) References Cited

U.S. PATENT DOCUMENTS

| | | | | |
|---|---|---|---|---|
| 5,640,349 A | * | 6/1997 | Kakinuma et al. | 365/185.33 |
| 6,018,478 A | * | 1/2000 | Higuchi | 365/189.14 |
| 2003/0214861 A1 | * | 11/2003 | Takano et al. | 365/200 |
| 2007/0211559 A1 | * | 9/2007 | Choi et al. | 365/233 |
| 2008/0151618 A1 | * | 6/2008 | Sharon et al. | 365/185.02 |
| 2008/0201538 A1 | | 8/2008 | Furuichi et al. | |
| 2009/0161435 A1 | * | 6/2009 | Park | 365/185.12 |
| 2009/0225596 A1 | * | 9/2009 | Shin et al. | 365/185.05 |

FOREIGN PATENT DOCUMENTS

| | | |
|---|---|---|
| JP | 2005-157781 | 6/2005 |
| JP | 2008-204528 | 9/2008 |
| KR | 1020020081925 | 10/2002 |

* cited by examiner

*Primary Examiner* — Dang Nguyen (74) *Attorney, Agent, or Firm* — Volentine & Whitt, PLLC (57) ABSTRACT

A method is for operating a nonvolatile memory device, where the memory device includes a memory cell array and a page buffer block. The method includes loading program data into the page buffer block, loading random sequence data into the page buffer block, generating randomized data by executing a logic operation, such as a bit-wise XOR operation, in the page buffer circuit on the program data and the first random sequence data, and programming the randomized data into the memory cell array.

8 Claims, 10 Drawing Sheets

NONVOLATILE MEMORY DEVICE AND DATA RANDOMIZING METHOD THEREOF

CROSS-REFERENCE TO RELATED APPLICATION

A claim of priority under 35 U.S.C. §119 is made to Korean Patent Application No. 10-2009-0030504, filed Apr. 8, 2009, the entire contents of which are herein incorporated by reference.

BACKGROUND

Example embodiments generally relate to a nonvolatile memory devices, and more particularly, to flash memory devices which include a random sequence generator and to methods of randomizing data.

Generally, a flash memory device has non-volatile and other characteristics like that of an EEPROM. However, unlike the EEPROM, the flash memory device is capable of programming and erasing multiple memory regions in a single programming (or erasing) operation. This feature in particular has increased the popularity of flash memory devices for electronic devices requiring high speed operation and large data handling capabilities.

In the meantime, however, nonvolatile memory devices (including flash memory) can suffer from degradation of storage elements (within memory cells) after being subjected to a large number of programming operations. In flash memory devices, this degradation often results from degradation of an insulating layer that neighbors the storage element after numerous repetitive program operations. Thus, in an effort to enhance the endurance of flash memory devices, data randomization techniques have been adopted to avoid excessive repetitive programming of the same flash memory cells.

SUMMARY

According to one of exemplary embodiments, a method of operating a nonvolatile memory device including a memory cell array and a page buffer block is provided. The method includes loading program data into the page buffer block, loading random sequence data into the page buffer block, generating randomized data by executing a logic operation in the page buffer circuit on the program data and the first random sequence data, and programming the randomized data into the memory cell array.

According to another exemplary embodiment, a nonvolatile memory device is provided which includes a memory cell array storing data information, a random sequence generator configured to generate random sequence data, a page buffer block configured to latch data to be programmed to the memory cell array, and a control logic configured to control the random sequence generator and the page buffer block. The control logic controls the random sequence generator and the page buffer block such that the random sequence data is loaded into the page buffer circuit after the data to be programmed is loaded, and further, the control logic controls the page buffer circuit to perform a logic operation in which the loaded data is randomized based on the loaded random sequence data.

According to other exemplary embodiment, a program method of a nonvolatile memory device including a memory cell array and a page buffer block is provided. The method includes loading program data into the page buffer block, loading random sequence data into the page buffer block, generating randomized data by executing a logic operation in the page buffer circuit on the program data and the first random sequence data, and programming the randomized data into the memory cell array, where the random sequence data is loaded into the page buffer block before or after the program data is loaded into the page buffer block.

BRIEF DESCRIPTION OF THE DRAWINGS

It should be understood that various aspects of the drawings may have been exaggerated for clarity. Example embodiments will be described in detail below with reference to the accompanying drawings, in which.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
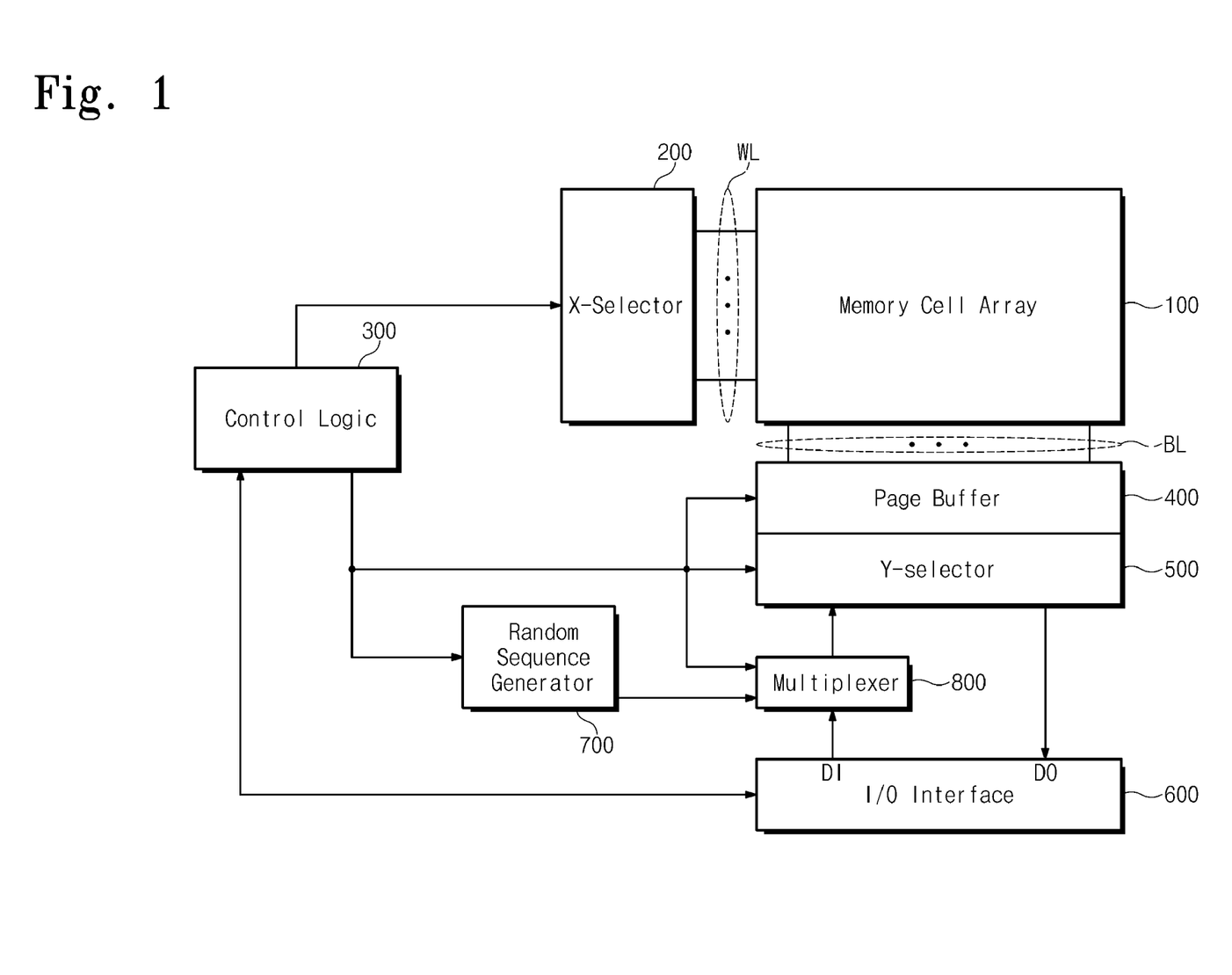
FIG. 1 shows a block diagram of a nonvolatile memory device according to an example embodiment.

FIG. 1 shows a block diagram of a nonvolatile memory device according to an example embodiment. Referring to FIG. 1, the nonvolatile memory device (e.g., a flash memory) includes a memory cell array 100, a row decoder 200, a control logic 300, a page buffer block 400, a column selector 500, an Input/Output interface 600, a random sequence generator 700 and a multiplexer 800.

The memory cell array 100 includes a plurality of memory cells at each respectively located where one of a plurality of word lines and one of a plurality of bit lines intersect each other. Each memory cell stores 1-bit data or multi-bit data (i.e., M-bit data, where M is an integer of 2 or more). Also each memory cell may be constructed to have a storage element like a floating gate or a charge trap layer, or a variable resistance element like a phase change material or a metal oxide material. The memory cell array 100 may be a single layer structure (known as a 2-dimensional array structure), or a multi-layer structure (known as a called 3-dimensional array structure).

The row decoder 200 is configured to select a word line or word lines of the memory cell array 100 and transfers a high voltage to the selected word line, under the control of the control logic 300. The control logic 300 is configured to control an overall operation of the nonvolatile memory device. The page buffer block 400 functions as a sense amplifier or a write driver according to an operating mode, under the control of the control logic 300. For example, the page buffer block 400 operates as a sense amplifier to sense data from the memory cell array 100 during a read operation, and as a write driver to write program data to the memory cell array 100 during a write operation. The page buffer block 400 includes a plurality of page buffers that correspond to a bit line or a pair of bit lines of the memory cell array 100, respectively. If each memory cell in the memory cell array 100 stores multi-bit data, each page buffer of the page buffer block 400 may include 2 or more latches.

Still referring to FIG. 1, the column decoder 500 is controlled by the control logic 300, selects page buffers of the page buffer block 400 in accordance with a predetermined selection order, and transfers data to the Input/Output 600. The Input/Output 600 outputs data to an external device like a memory controller. The random sequence generator 700 generates random sequence data RSD using a seed value, under the control of the control logic 300. The random sequence data RSD may be 1-bit data, or multi-bit data. The multiplexer 800, in response to the control of the control logic 300, transfers program data inputted from the Input/Output 600 to the column decoder 500 during a data loading time of a program operation, and after the data loading time, transfers the random sequence data RSD inputted from the random sequence generator 700 to the column decoder 500. The random sequence data RSD is provided to a group of page buffers that is selected by the column decoder 500. During the data loading time, the selected page buffers receive the program data from the Input/Output 600 through the multiplexer 800. Thus, the page buffer block 400 is configured to receive the program data during the data loading time and the random sequence data RSD after the data loading time. This means that each page buffer of the page buffer block 400 may have at least two latches, one to store the program data and the other to store the random sequence data RSD. The page buffer block 400 executes a bit-wise XOR operation on the inputted program data based on the inputted random sequence data, under the control of the control logic 300. As a result of execution of the bit-wise XOR operation, the program data is randomized. Each page buffer of the page buffer block 400 may include another latch to store the randomized program data. Also, each page buffer of the page buffer block 400 may be configured to store the randomized program data to the latch that stored the program data before the execution of the XOR operation. For the execution of XOR operation, each page buffer may include XOR logic circuit.

Execution of bit-wise XOR of each page buffer of the page buffer block 400 also occurs for a read operation in the same way as program operation. While data from the memory cell array 100 is sensed in each page buffer, the page buffer block 400 receives a random sequence data RSD from the random sequence generator 700 through the multiplexer 800. After finishing data sensing operation, the page buffer block 400 executes a bit-wise XOR operation on the sensed data based on the random sequence data RSD, under the control of the control logic 300. As a result of the bit-wise XOR operation, the sensed data is de-randomized as original program data.

The nonvolatile memory device in accordance with one of exemplary embodiments is configured to randomize program data for a program operation and to de-randomize read data from the memory cell array for a read operation. The randomization of program data and the de-randomization of read data are executed in the page buffer block 400, rather than external of the nonvolatile memory device. This means that randomization and de-randomization on data is not performed in a data input/output path of the nonvolatile memory device. This aspect along with other aspects of the illustrated embodiments will be discussed in greater detail hereafter.

Figure 2:
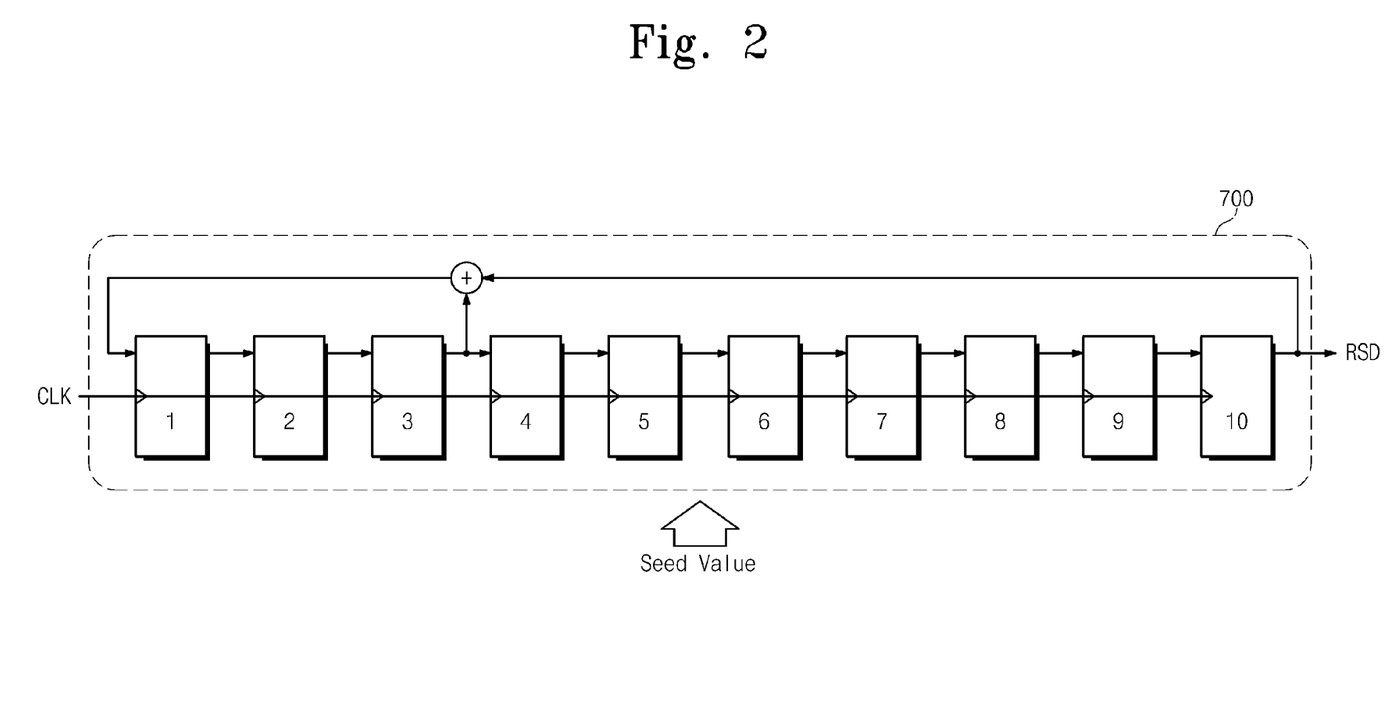
FIG. 2 is a circuit diagram showing a random sequence generator illustrated in FIG. 1 according to one of example embodiments.

FIG. 2 is a circuit diagram showing a random sequence generator illustrated in FIG. 1 according to one of exemplary embodiments. Referring to FIG. 2, the random sequence generator 700 includes a linear feedback shift register LFSR having shift registers and a XOR unit. The random sequence generator 700 may be implemented by a PN sequence generator, a CRC generator, and the like. The random sequence generator 700 generates random sequence data RSD using a page address to be accessed for operation as a seed value. In this exemplary embodiment, the random sequence data may be 1-bit data. The random sequence data RSD is generated in response to a clock signal that may be provided from the control logic 300.

Figure 3:
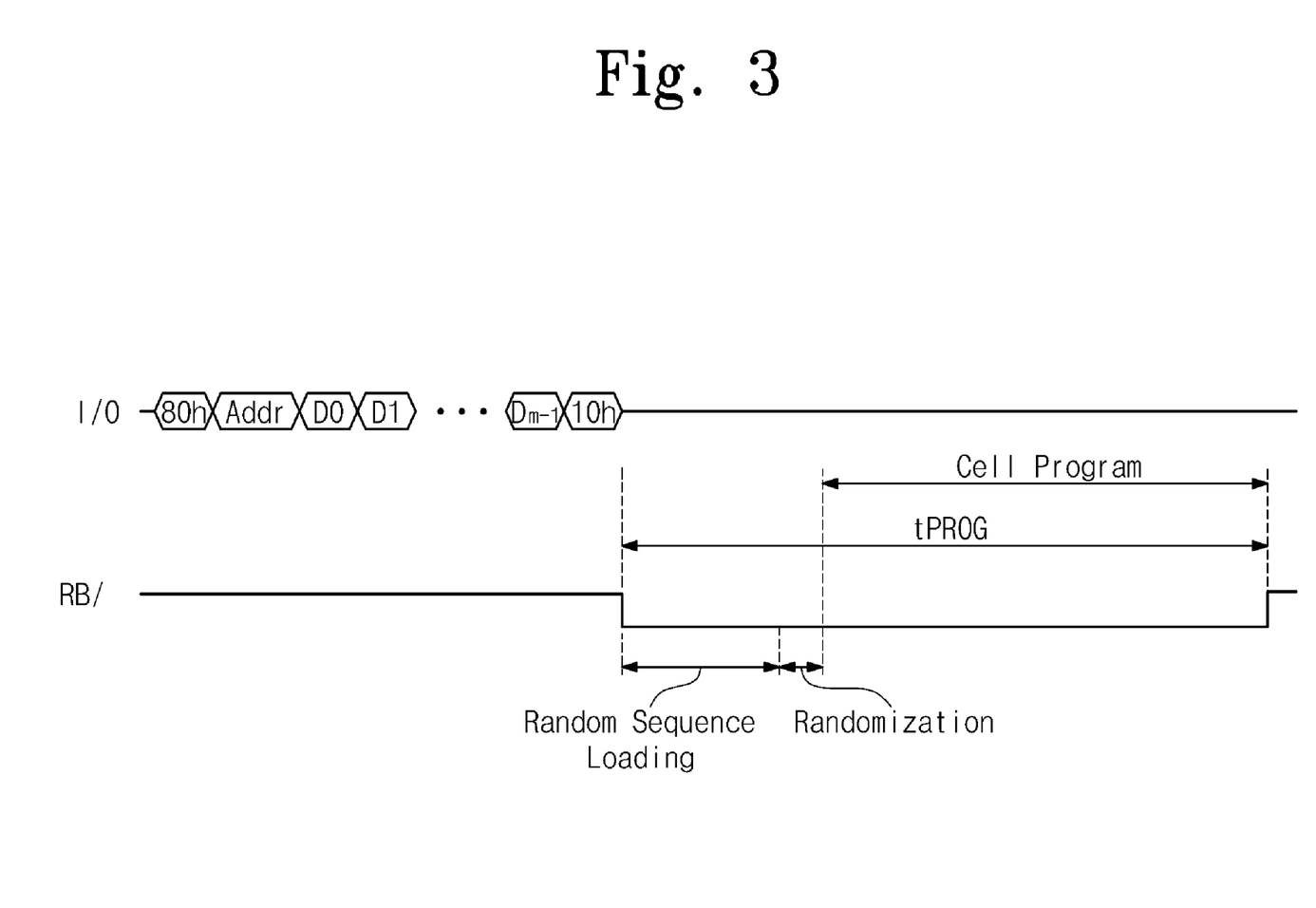
FIG. 3 is a timing diagram to explain a program operation of the nonvolatile memory device in accordance with one example embodiment.
Figure 4:
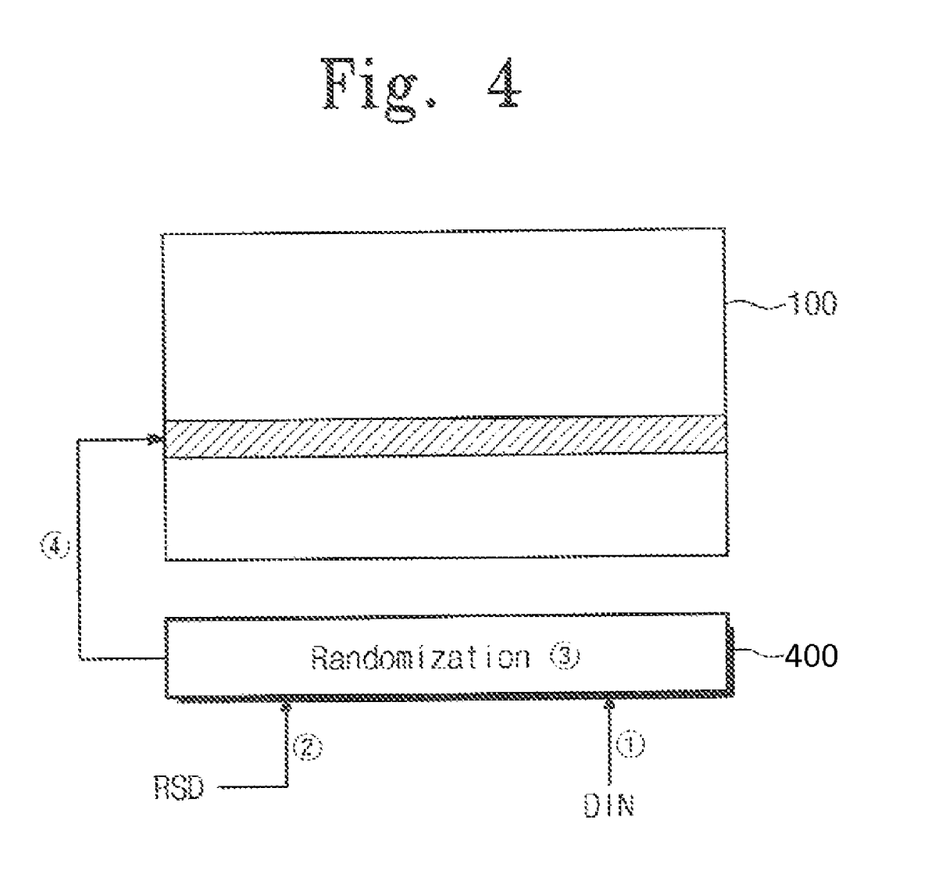
FIG. 4 shows a data flow in the nonvolatile memory device during a program operation according to one example embodiment.

FIG. 3 is a timing diagram for use in explaining a program operation of the nonvolatile memory device in accordance with one example embodiment. FIG. 4 shows a data flow in the nonvolatile memory device during a program operation according to one example embodiment. Hereinafter, a program operation will be described with reference to FIG. 3 and FIG. 4.

First, a serial input command '80h' is inputted to the nonvolatile memory device from an external device. As this example, the external device is a memory controller. Then an address (Addr), including a row address and a column address, and program data D0~Dm-1 are inputted to the nonvolatile memory device from the memory controller with a certain timing sequence. (Refer to circle-1 in FIG. 4). The row address comprises a plurality of addresses including a block address and a page address. The program data is loaded into the page buffer block 400 through the multiplexer 800 and the column decoder 500 under the control of the control logic 300. After completion of the data loading into the page buffer block 400, a program command '10h' is inputted to the nonvolatile memory device. After then, a Ready/Busy signal (RB/) changes to low to indicate that the nonvolatile memory device is in a busy state.

When the program command '10h' is inputted, the control logic 300 controls the random sequence generator 700 to generate random sequence data RSD using the page address included in the inputted row address as a seed value. The generated random sequence data RSD is loaded into the page buffer block 400 through the multiplexer 800 and the column decoder 500 under the control of the control logic 300. (Refer to circle-2 in FIG. 4). That is, the program data and the RSD are loaded into page buffers of the page buffer block 400, each of which includes latches to store the program data and the RSD.

Once the program data and the random sequence data RSD are loaded into page buffers, the control logic 300 controls the page buffer block 400 to randomize the program data based on the random sequence data RSD. (Refer to circle-3 in FIG. 4). In this example, a bit-wise XOR operation is performed in the page buffer block 400 so that the program data is randomized. Then, the randomized data are programmed to the memory cells associated with the page address. (Refer to circle-4 in FIG. 4). In FIG. 3, tPROG denotes the total programming time including the random sequence loading, randomization, and cell programming.

Figure 5:
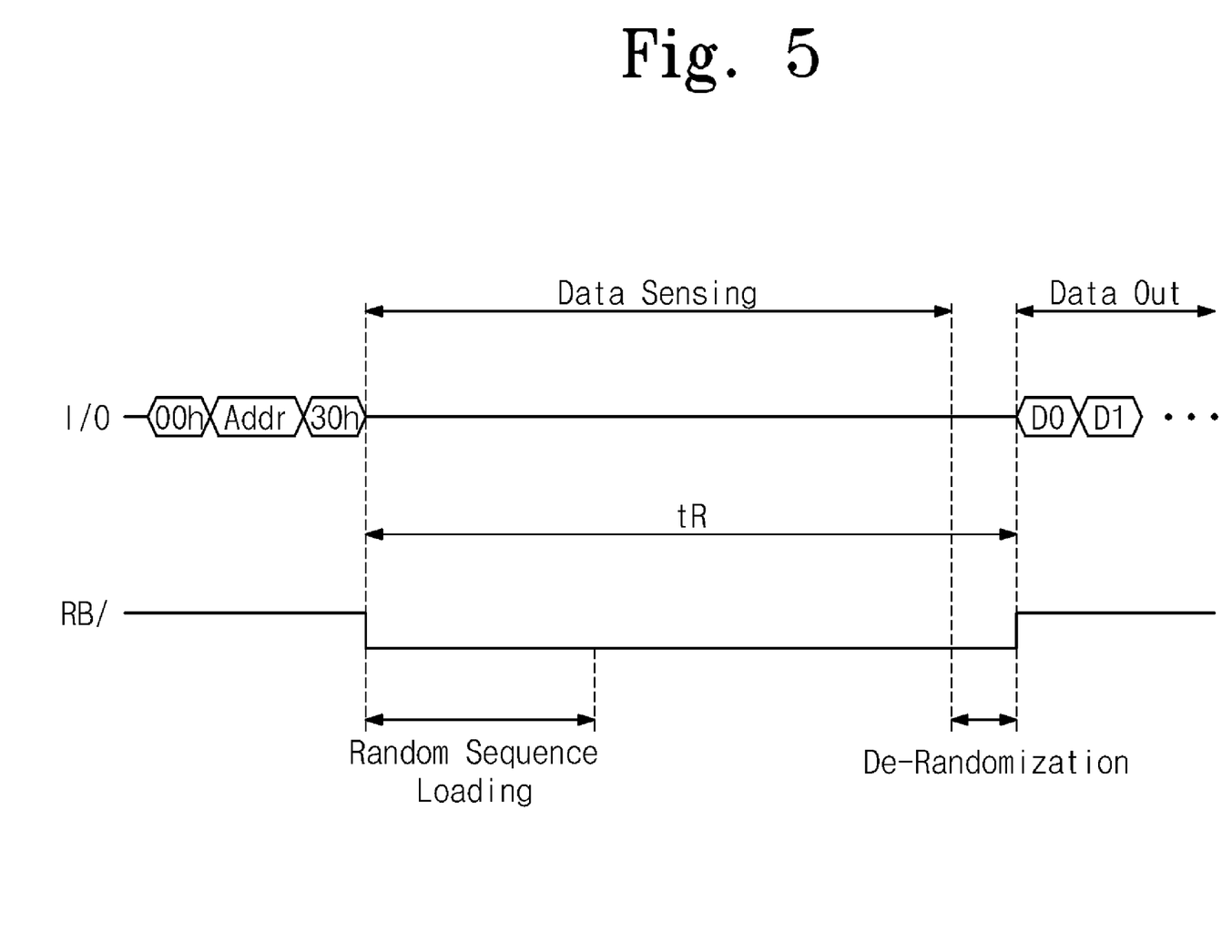
FIG. 5 is a timing diagram to explain a read operation of the nonvolatile memory device in accordance with one example embodiment.
Figure 6:
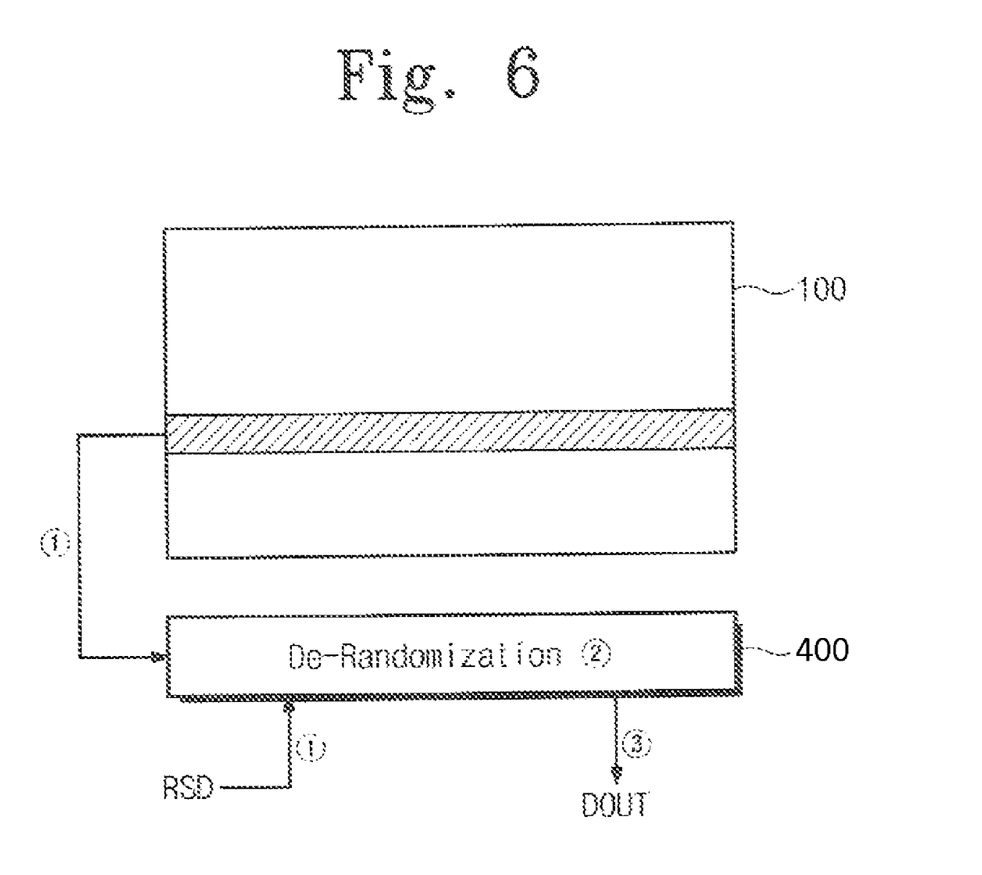
FIG. 6 shows a data flow in the nonvolatile memory device during a read operation according to one example embodiment.

FIG. 5 is a timing diagram for use in explaining a read operation of the nonvolatile memory device in accordance with one example embodiment. FIG. 6 shows a data flow in the nonvolatile memory device during read operation according to one example embodiment. Hereinafter, a read operation will be described with reference to FIG. 5 and FIG. 6.

For a read operation, a '00h' command, an address (Addr) and a '30h' command is inputted to the nonvolatile memory device at a certain timing sequence. After the '30h' command is inputted, the Ready/Busy signal (RB/) changes to low indicating that the nonvolatile memory device is in a busy state. The page buffer block 400 begins to sense read data from the memory cells of the memory cell array 100 that are associated with the address, and the page buffer block 400 latches the read data, under the control of the control logic 300. (Refer to circle-1 in FIG. 6). As shown in FIG. 5, a data sensing time includes a time required for random sequence loading. During the time the read data is sensed and latched, the control logic 300 controls the random sequence generator 700 to generate a random sequence data using a page address included in the inputted address as a seed value. The generated RSD is loaded into the page buffer block 400 through the multiplexer 800 and 500, under the control of the control logic 300. (Refer to 1 in FIG. 6).

Once data sensing and latching is completed, the control logic 300 controls the page buffer block 400 to execute a bit-wise XOR operation on the read data based on the RSD that are latched in each page buffer. As a result, the read data is de-randomized as original data, i.e., the data is restored to its state before randomization during the program operation. (Refer to circle-2 in FIG. 6). Thereafter, the de-randomized read data is outputted to the memory controller through the column decoder 500 and the Input/Output 600. (Refer to circle-3 in FIG. 6). In FIG. 5, tR denotes a read time including data sensing and de-randomization. As mentioned earlier, the random sequence loading occurs during data sensing.

Figure 7:
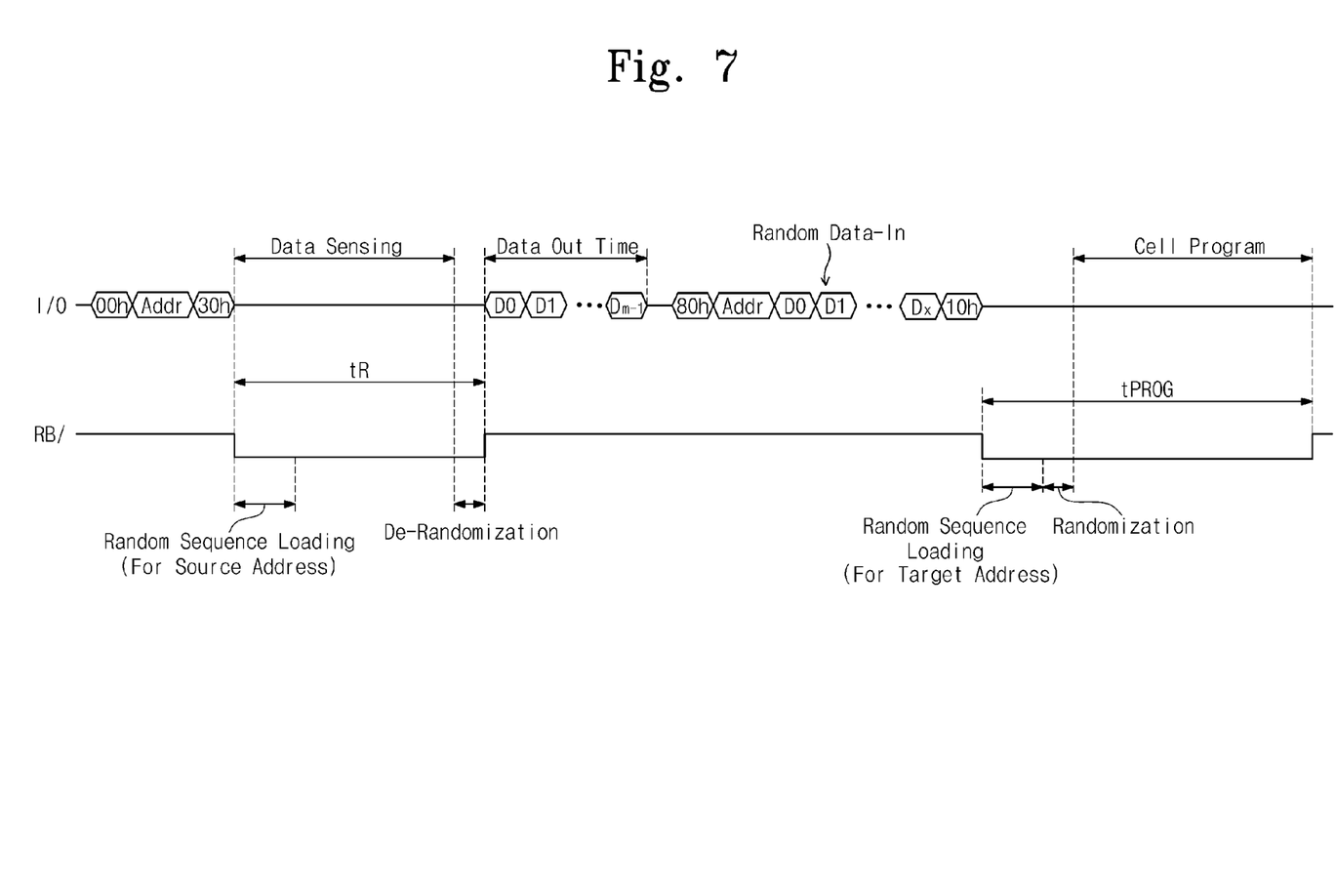
FIG. 7 is a timing diagram to explain a page copy back program operation of the nonvolatile memory device in accordance with one example embodiment.
Figure 8:
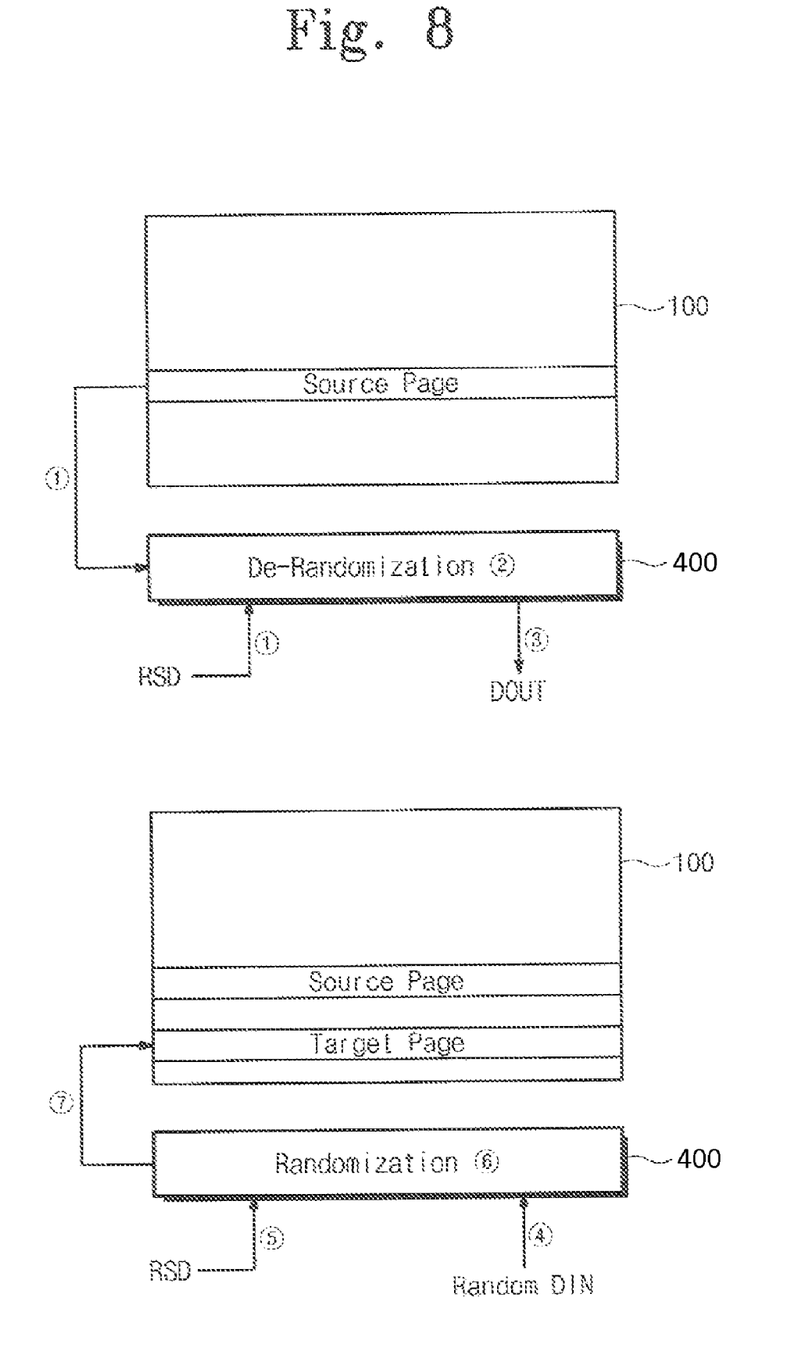
FIG. 8 shows a data flow in the nonvolatile memory device during a page copy back program according to one example embodiment.

FIG. 7 is a timing diagram for use in explaining a page copy back program operation of the nonvolatile memory device in accordance with one example embodiment. FIG. 8 shows a data flow in the nonvolatile memory device during the page copy back program according to one example embodiment. Hereinafter, a page copy back program operation will be described in detail with reference to FIG. 7 and FIG. 8.

For a page copy back program operation, a '00h' command, an address (Addr), and a '30h' command is successively inputted to the nonvolatile memory device from the memory controller at a certain timing sequence. After the '30h' command is inputted, the Ready/Busy signal (RB/) changes to low indicate that the nonvolatile memory device is in a busy state. Then the page buffer block 400 begins to sense data from a source page of the memory cell array 100 that is associated with a page address of the inputted address, and latches the sensed data, under the control of the control logic 300. (Refer to circle-1 in FIG. 8). During the sensing and latching time, the control logic 300 controls the random sequence generator 700 to generate a random sequence data RSD using the page address of the inputted address as a seed value. The generated RSD is loaded into the page buffer block 400 through the multiplexer 800 and the column decoder 500 under the control of the control logic 300.

After data sensing and latching is completed, the control logic 300 controls the page buffer block 400 to execute a bit-wise XOR operation on the sensed data based on the RSD that are latched in the page buffer block 400 so that the sensed data is de-randomized as original data. (Refer to circle-2 in FIG. 4). After de-randomization, the de-randomized data is outputted to the memory controller through the column decoder 500 and the Input/Output 600 during data output time. (Refer to circle-3 in FIG. 8).

An error detection/correction operation is performed on the outputted de-randomized data in the memory controller. If an error is detected in the outputted de-randomized data, the error is corrected and the corrected data is inputted to the nonvolatile memory device. Then, as described next, the inputted data is programmed to memory cells associated with a target page through randomization.

An '80h' command, an address (Addr) and the corrected data (D0~Dx) are inputted to the nonvolatile memory device after error detecting and error correction at a certain timing sequence. (Refer to circle-4 in FIG. 8). The corrected data is loaded into the page buffer block 400 through the Input/Output 600 and the multiplexer 800 under the control of the control logic 300. After loading of the corrected data is complete, a program confirmation command '10h' is inputted to the nonvolatile memory device. Thereafter, the control logic 300 controls the random sequence generator 700 to generate a random sequence data RSD using a target address included in the inputted address as a seed value. The generated RSD is loaded into the page buffer block 400 through the multiplexer 800 and the column decoder 500, under the control of the control logic 300. (Refer to circle-5 in FIG. 8). Thus, the corrected data and the generated RSD have been latched in the page buffer block 400.

Thereafter, the control logic 300 controls the page buffer block 400 to execute a bit-wise XOR operation on the corrected data based on the RSD. (Refer to circle-6 in FIG. 8). That is, the corrected data is randomized and then programmed into a memory cell associated with the target page of the memory cell array 100. (Refer to circle-7 in FIG. 8). If there is no error in the outputted data, the error correction operation does not occur and the corrected data is the same as the outputted data from the source page.

In contrast to the above-described page copy back operation which includes input of corrected data as a de-randomized data after error detection and correction, the nonvolatile memory device may instead execute a page copy back operation without input of corrected data as the de-randomized data. For this case, once read operation for the source page begins, the address of target page is inputted from the memory controller. Then a random sequence data RSD is generated based on the address of target page and loaded into the page buffer block 400. The page buffer block 400 executes bit-wise XOR operation on the read data based on the RSD that are latched in the page buffer block 400, under the control of the control logic 300. Thereafter, the randomized data is programmed to the target page.

As explained above, randomization and de-randomization is executed in the page buffer, rather than in data input or output path. This may enhance both the reliability of nonvolatile memory device and the speed of the program and read operations.

Although not shown in figures, it will be understood that it is possible to load random sequence data into page buffers before sensing data from a memory cell array or loading data to be programmed.

Figure 9:
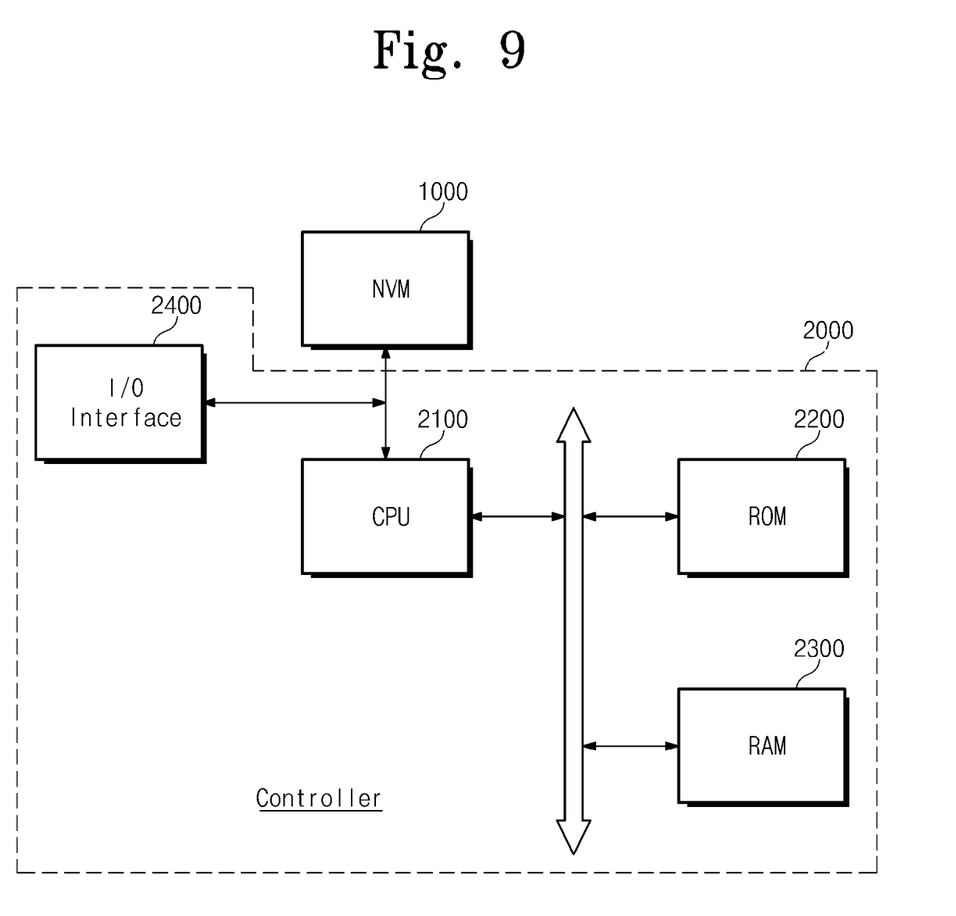
FIG. 9 is a block diagram showing an integrated circuit card (IC card) including a nonvolatile memory device according to one example embodiment.

FIG. 9 is a block diagram showing an integrated circuit card IC card including a nonvolatile memory device according to one or more example embodiments. Referring to FIG. 9, the IC card, e.g., smart card, includes a nonvolatile memory device NVM 1000 and a controller 2000. The NVM 1000 may be substantially same to the nonvolatile memory device as is illustrated in FIG. 1 and is configured to execute data randomization in accordance with one or more of the embodiments herein. So, details of the NVM 1000 are omitted to avoid redundancy in the description. The controller 2000 includes CPU 2100, ROM 2200, RAM 2300 and I/O interface 2400. CPU 2000 controls overall operation of the IC card using a program stored in the ROM 2200. The I/O interface provides an interface with one or more other external devices.

Figure 10:
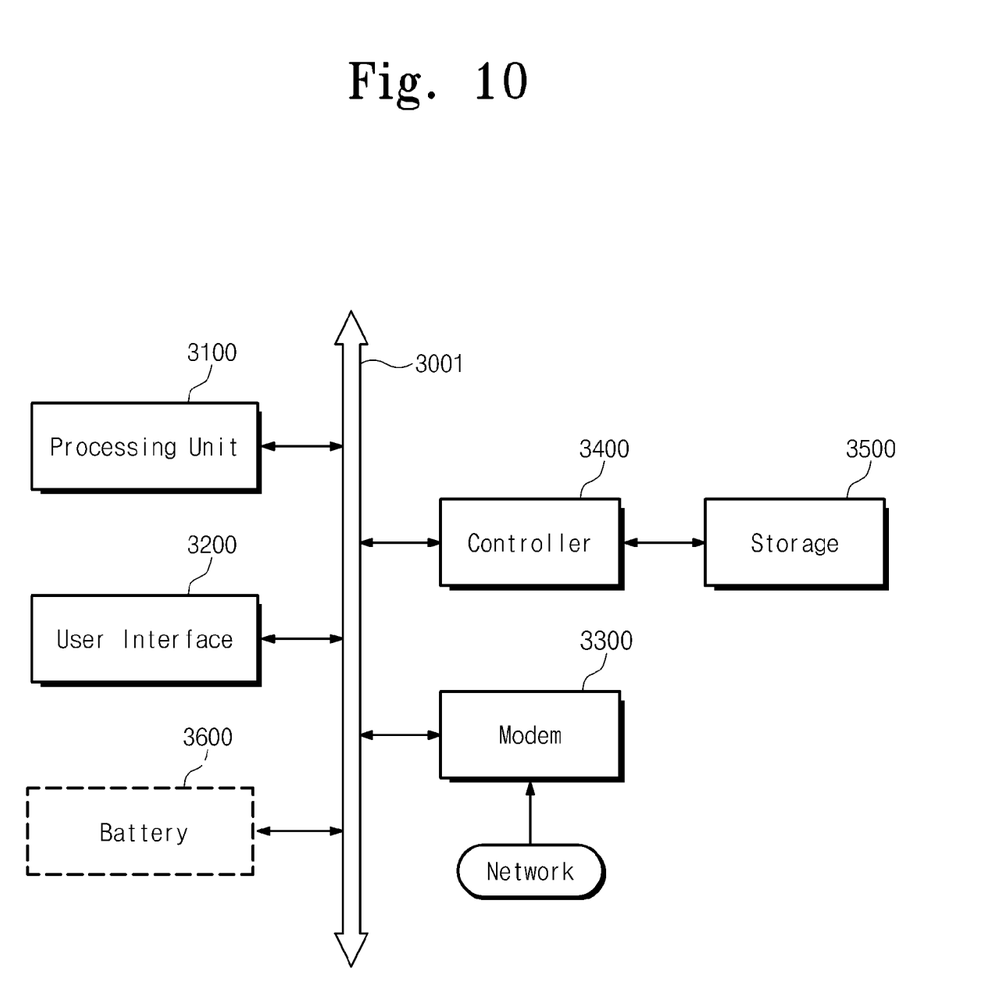
FIG. 10 is block diagram showing a computing system including a nonvolatile memory device in accordance with one example embodiment.

FIG. 10 is block diagram showing a computing system including a nonvolatile memory device in accordance with one or more example embodiments. Referring to FIG. 10, the computing system includes a processing unit 3100, a user interface 3200, a modem 3300, a controller 3400, which are connected to a system bus 3001, and a nonvolatile memory device 3500. The controller 3400 and the nonvolatile memory device 3450 may have substantially the same construction as shown in FIG. 1, and are configured to execute data randomization in accordance with one or more of the embodiments herein. N-bit data that are processed or to be processed by the processing unit 3100 is stored in the nonvolatile memory device 3500. If the computing system in accordance with one example of embodiments is a mobile device, a battery 3600 for providing an operating voltage for the computing system may be included in the computing system. Though not shown in FIG. 10, it will understood that the computing system may further include an application chipset, a camera image processor CIS, a mobile DRAM or the like.

The nonvolatile memory device 3500 and/or the controller 3400 may be mounted in any of a variety of different package technologies, such as, Package on Package (PoP), Ball Grid Array (BGA), Chip Scale Package (CSPs), Plastic Leaded Chip Carrier (PLCC), Plastic Dual In-Line Package (PDIP), Die in Waffle Pack, Die in Wafer Form, Chip on Board (COB), Ceramic Dual In-Line Package (CERDIP), Plastic Metric Quad Flat Pack (MQFP), Thin Quad Flat Package (TQFP), Small Outline IC (SOIC), Shrink Small Outline Package (SSOP), Thin Small Outline Package (TSOP), Thin Quad Flat Package (TQFP), System In Package (SIP), Multi Chip Package (MCP), Wafer-level Fabricated Package (WFP), Wafer-level Processed Stack Package (WSP).

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of operating a nonvolatile memory device including a memory cell array and a page buffer block, the method comprising:
    loading program data into the page buffer block;
    loading first random sequence data into the page buffer block;
    generating randomized data in the page buffer block by executing a logic operation on the program data and the first random sequence data;
    programming the randomized data into the memory cell array;
    sensing data during a sensing period from the memory cell array;
    loading second random sequence data during the sensing period into the page buffer block;
    generating de-randomized data in the page buffer block by executing the logic operation on the sensed data and the second random sequence data; and
    outputting the de-randomized data.

2. The method of claim 1, wherein the second random sequence data is generated using an address associated with the sensed data as a seed value.

3. The method of claim 1, wherein the logic operation is a bit-wise XOR operation.

4. The method of claim 1, wherein the program data is random data received during a copy-back program operation.

5. The method of claim 1, wherein the nonvolatile memory device is a flash memory device.

6. A method of operating a nonvolatile memory device including a memory cell array and a page buffer block, the method comprising:
    receiving a read command directed to data previously randomized and programmed into the memory cell array, and in response to the read command,
        sensing the previously randomized and programmed data and latching corresponding sensed data in the page buffer during a sensing period;
        latching random sequence data in the page buffer block during the sensing period;
        internally generating de-randomized data within the page buffer block by executing a logic operation on the latched sensed data and the latched random sequence data; and then
        outputting the de-randomized data to a circuit external to the page buffer block.

7. The method of claim 6, further comprising:
    receiving an address associated with the read command, wherein the random sequence data is generated using the address as a seed value.

8. The method of claim 6, wherein the logic operation is a bit-wise XOR operation.

* * * * *